United States Patent
Kim et al.

(10) Patent No.: US 9,142,296 B2
(45) Date of Patent: Sep. 22, 2015

(54) NONVOLATILE MEMORY DEVICE AND METHOD FOR DRIVING THE SAME

(71) Applicant: SK HYNIX INC., Icheon (KR)

(72) Inventors: Nam Kyeong Kim, Icheon (KR); Byoung Sung Yoo, Seoul (KR)

(73) Assignee: SK HYNIX INC., Icheon (KR)

( * ) Notice: Subject to any disclaimer, the term of this patent is extended or adjusted under 35 U.S.C. 154(b) by 106 days.

(21) Appl. No.: 13/940,194

(22) Filed: Jul. 11, 2013

(65) Prior Publication Data

US 2014/0056074 A1 Feb. 27, 2014

(30) Foreign Application Priority Data

Aug. 27, 2012 (KR) ........................ 10-2012-0093600

(51) Int. Cl.
*G11C 16/00* (2006.01)
*G11C 16/06* (2006.01)
*G11C 16/04* (2006.01)
*G11C 16/08* (2006.01)
*G11C 16/12* (2006.01)
*G11C 16/34* (2006.01)

(52) U.S. Cl.
CPC ............ *G11C 16/06* (2013.01); *G11C 16/0483* (2013.01); *G11C 16/08* (2013.01); *G11C 16/12* (2013.01); *G11C 16/349* (2013.01)

(58) Field of Classification Search
CPC ....................................................... G11C 16/00
USPC ..................................................... 365/185.02
See application file for complete search history.

(56) References Cited

U.S. PATENT DOCUMENTS

| | | | | |
|---|---|---|---|---|
| 2005/0254302 A1* | 11/2005 | Noguchi | ................... | 365/185.17 |
| 2008/0104309 A1* | 5/2008 | Cheon et al. | ................... | 711/103 |
| 2010/0135075 A1* | 6/2010 | Moschiano et al. | ..... | 365/185.02 |
| 2012/0008390 A1* | 1/2012 | Seong | ....................... | 365/185.03 |

* cited by examiner

*Primary Examiner* — Min Huang

(57) ABSTRACT

A nonvolatile memory includes a memory cell array including a plurality of nonvolatile memory cells connected to bit lines and word lines crossing the bit lines, a voltage driver configured to provide a word line voltage to the word lines and provide a first voltage during a precharging operation and a second voltage during a sensing operation, based on a voltage setting signal, and a page buffer unit configured to adjust a precharging level of a sensing node connected to a bit line of a page included in a selected memory block of the memory cell array using the first voltage and adjust a sensing level of the sensing node using the second voltage.

18 Claims, 14 Drawing Sheets

|  | SEL<1> | SEL<2> | SEL<3> | ... | SEL<i> |
|---|---|---|---|---|---|
| V1 | 3 | - | 2.0 | ... | - |
| V2 | 3 | - | 2.0 | ... | - |
| NUMBER OF '0' CELLS | 1 | 5 | 20 | ... | - |

Fig.6

NONVOLATILE MEMORY DEVICE AND METHOD FOR DRIVING THE SAME

CROSS-REFERENCES TO RELATED APPLICATION

The present application claims priority to Korean patent application number 10-2012-0093600, filed on 27 Aug., 2012, which is incorporated by reference herein in its entirety.

BACKGROUND OF THE INVENTION

1. Technical Field

The present invention relates to a nonvolatile memory device, and more particularly, to a nonvolatile memory device and a method for driving the same, which recognize a program property in block units including memory cells and adjust the voltage level of a sensing node.

2. Related Art

Memory manufacturers have been steadily developing next-generation memories to overcome limitations of flash memory devices, which are nonvolatile memory devices. The next-generation memories typically include ferroelectric random access memories (FeRAMs), magnetic RAMs (MRAMs), phase-change RAMs (PCRAMs), nano floating gate memories (NFGMs), resistive RAMs (ReRAMs), spin transfer torque magnetic RAMs (STTRAM), and the like.

A memory cell of a flash memory traps charges in a floating gate through Fowler Nordheim (F-N) tunneling. When a constant voltage is applied to a gate electrode of a memory cell, data is determined according to the amount of current flowing in a channel, which depends on the amount of charges trapped in the floating gate.

SUMMARY

An embodiment of the present invention is directed to recognizing program properties of memory cells included in a nonvolatile memory device and compensating for a precharge current provided to the memory cells or controlling the voltage level of a sensing node, which is a criterion of data determination.

Therefore, it is possible to prevent data read failure even if memory cells have different program properties from each other.

Further, since the level of the sensing node is controlled according to a program property of a memory cell, it is possible to reduce a level of the current actually flowing in the memory cell and minimize degradation of the memory cell due to repetitive write/erase operations of the nonvolatile memory device.

In addition, an embodiment of the present invention is directed to adaptively controlling the voltage level of a sensing node according to the degradation level of the nonvolatile memory device to improve operational stability even if the nonvolatile memory device is degraded.

According to one aspect of an embodiment, there is provided a nonvolatile memory device. The nonvolatile memory device may include: a memory cell array including a plurality of blocks, each block including a plurality of pages each of which includes a plurality of memory cells coupled to a plurality of bit lines and a plurality of word lines crossing the bit lines; a voltage driver configured to provide a plurality of word line voltages to the word lines, and generate a first voltage during a precharging operation and a second voltage during a sensing operation, based on a voltage setting signal; and a page buffer unit configured to adjust a precharging level of a sensing node coupled to a selected bit line of a selected page included in a selected block of the memory cell array using the first voltage, and adjust a sensing level of the sensing node using the second voltage.

In some embodiments, the voltage setting signal may be stored in a flag region included in the page of the memory cell array or a controller or a code address memory (CAM) region included in the nonvolatile memory device.

According to another aspect of an embodiment, there is provided a method for driving a nonvolatile memory device. The method may include: performing a predetermined number of loop programs of an incremental step pulse program on a first page included in a selected memory block of a memory cell array; generating a voltage setting signal based on a program property of the first page a predetermined number of loop programs is completed; and adjusting a precharging level of a sensing node of the selected memory block using a first voltage generated based on the voltage setting signal during a precharging operation and adjusting a sensing level of the sensing node using a second voltage generated based on the voltage setting signal during a sensing operation.

In some embodiments, the method may further include storing the voltage setting signal.

The method may further include reading the stored voltage setting signal and reading data written in the memory cell array.

A nonvolatile memory device according to an embodiment of the present invention recognizes a programming state after the predetermined program loop is performed, thereby recognizing a program property of a nonvolatile memory cell in the step of starting programming for the nonvolatile memory cell. The nonvolatile memory device determines the degree of adjustment in the level of the sensing node according to the recognized programming state in the precharging and sensing operations, thereby completing the programming.

That is, the nonvolatile memory device sets a voltage to be applied to the sensing node based on the program property of the memory cell, and thus, adjusts the level of the sensing node during a programming operation as well as a write and verify operation, thereby obtaining substantially the same effect as when controlling a level of a cell current flowing in the memory cell.

A nonvolatile memory device according to an embodiment stores the voltage setting signal for compensating the level of the sensing node in a flag region having the same structure as that of the memory cell for writing data, thereby improving accuracy of the voltage setting signal.

A method of a nonvolatile memory device according to an embodiment sets the current flowing in the memory cell to be smaller and performs the operation in a manner that compensates for the current.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIG. 6 illustrates a voltage-setting matching table showing a relationship between a voltage select signal and first and second voltages;

DETAILED DESCRIPTION

Hereinafter, embodiments of the present disclosure will be described in detail with reference to the accompanying drawings.

Figure 1:
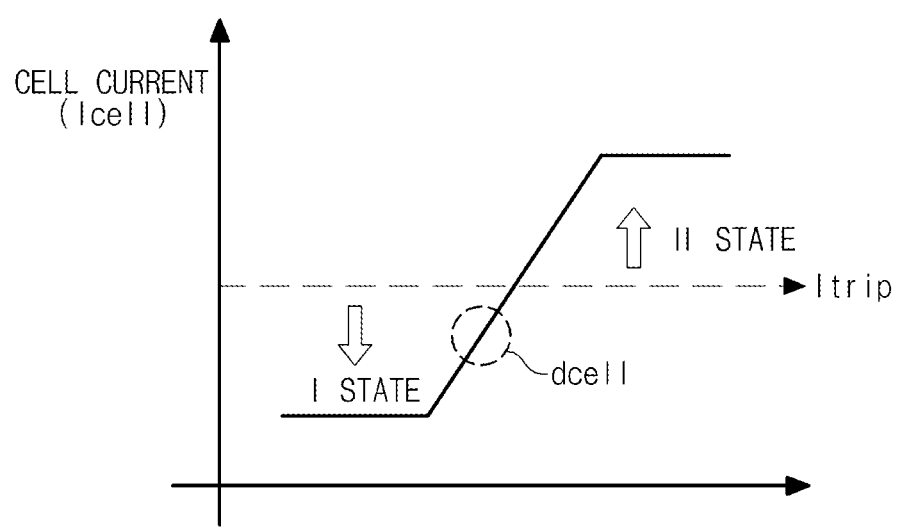
FIG. 1 is a view showing a method of classifying a nonvolatile memory cell into a programming state cell and an erasing state cell, which are determined according to a cell current and a program property of the nonvolatile memory cell.

FIG. 1 is a view illustrating a method of classifying a nonvolatile memory cell into a programming state cell and an erasing state cell.

In FIG. 1, the Y-axis indicates a level of a cell current Icell flowing through the nonvolatile memory cell.

Referring to FIG. 1, the memory cell may be in one of a first state I and a second state II, which is determined by comparing the cell current Icell flowing through the memory cell with a trip current Itrip. For example, if a threshold voltage of the memory cell is large, the cell current Icell flowing through the memory cell may be smaller than the trip current Itrip, and the memory cell is determined to be in the first state I. On the other hand, if the threshold voltage of the memory cell is small, the cell current Icell flowing through the memory cell may be greater than the trip current Itrip and the memory cell is determined to be in the second state II. In an embodiment, the first state I may correspond to the programming state, and the second state II may correspond to the erasing state. In another embodiment, the first state I may correspond to the erasing state, and the second state II may correspond to the programming state. In the present disclosure, for convenience of description, it is assumed that the first state I and the second state II correspond to the programming state and the erasing state, respectively.

As described above, whether the memory cell is in the first state I or the second state II may be determined by comparing the cell current Icell, which flows through the memory cell when a read voltage is applied to a gate of the memory cell, with the trip current Itrip. However, if the memory cell is degraded, even if the memory cell is in the first state I, a cell current flowing through the memory cell may change to be closer to the trip current Itrip, as indicated by 'dcell' in FIG. 1.

If the memory cell is degraded, the charge accumulation capability of a floating gate of the memory cell is degraded, and thus the degraded cell current dcell may flow through the degraded memory cell. The degraded cell current dcell may become more serious as a write operation and an erasing operation are repeatedly performed on the degraded memory cell. In the case that the degraded memory cell is supposed to be in the first state I, if a cell current having substantially the same level as or a higher level than the trip current Itrip flows through the degraded cell, the degraded memory cell is determined to be in the second state II. As a result, data read failure of the memory cell occurs, which contributes to degradation of the operational stability and reliability of the nonvolatile memory device.

Meanwhile, when the cell current Icell flowing through a selected memory cell is provided to a sensing node, the cell current Icell passes through a plurality of memory cells serially connected to the selected memory cell. Therefore, as the level of the cell current Icell becomes smaller through the serially connected memory cells, the finally sensed current at the sensing node may be smaller than the trip current Itrip. As a result, the selected memory cell is determined to be in the first state I, and thus the data read failure of the selected memory cell may occur.

Since the data read failure may occur according to a change in the cell current Icell as described above, the change in the cell current Icell should be compensated for according to a program property of the memory cell, thereby avoiding the data read failure.

A nonvolatile memory device according to an embodiment adjusts a precharging level and a sensing level of a sensing node according to a program property of a memory cell to compensate for a cell current Icell of the memory cell. In other words, programming, reading, and verifying operations of the memory cell are performed by controlling a precharge current and/or the trip current Itrip according to the program property of the memory cell. A program property may be any property indicating degradation of the memory cell, such as, for example, the ability of a floating gate in the memory cell to accumulate charges.

By controlling the precharge current, a level of the cell current Icell flowing through the memory cell may be controlled. By controlling the trip current Itrip, an attenuated level of the cell current Icell, which decreases while the cell current Icell passes through a plurality of memory cells serially connected to the memory cell to be provided to a sensing node SO, may be compensated for.

Figure 14A:
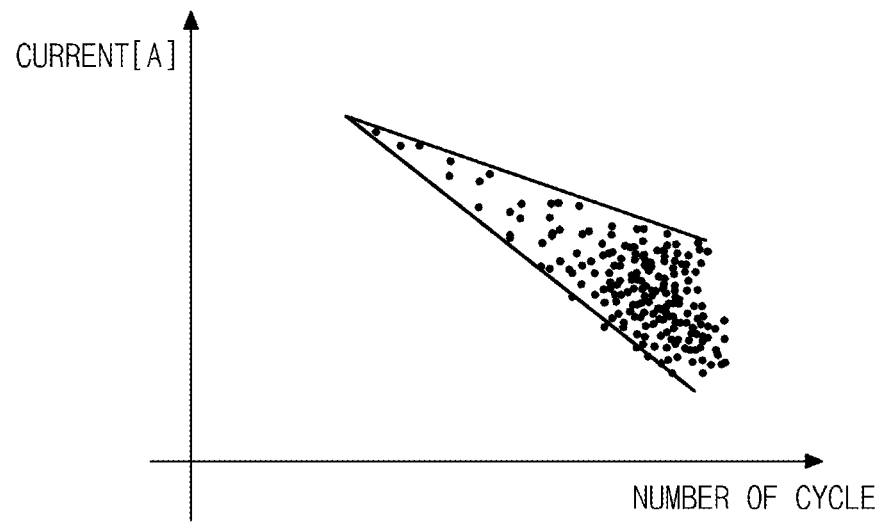
FIG. 14A shows degradation of cell currents flowing through memory cells when the number of erasing and programming operations repeatedly performed on the memory cells increases.

FIG. 14A shows degradation of a cell current Icell flowing through a nonvolatile memory cell as a number of erasing and writing operations repeatedly performed on the nonvolatile memory cell increases.

Referring to FIG. 14A, the cell current Icell, which flows through the memory cell in the erase state, decreases as the number of repetitive write/erase cycles increases. Thus, if data stored in the memory cell is determined based on the same level of the trip current Itrip without considering the reduction of the cell current Icell according to the number of the write/erase cycles, the operational stability of the nonvolatile memory cell may not be guaranteed if the number of the write/erase cycles becomes greater than a predetermined number.

In order to compensate for the reduction of the cell current Icell, the level of the trip current Itrip may be set to be low in an initial stage of the nonvolatile memory device. However, as a result, excessive electrons should be trapped in a floating gate of the memory cell in a programming operation of the memory cell, to thereby correctly detect the programming state of the memory cell, but degradation in the program property of the memory cell may be accelerated.

Figure 14B:
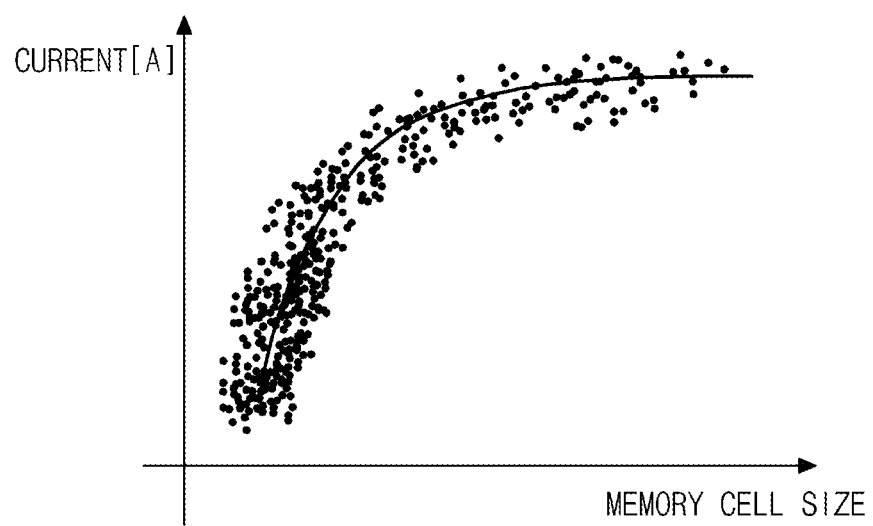
FIG. 14B shows reduction of cell currents when a memory cell size decreases.

FIG. 14B shows reduction of a cell current Icell when the size of the memory cell decreases.

Referring to FIG. 14B, when the size of the nonvolatile memory cell is greater than a certain size, the level of the cell current Icell does not significantly change. However, when the size of the nonvolatile memory cell becomes smaller than that certain size, the cell current Icell rapidly decreases. As a result, a criterion for determining a state of the memory cell, that is, a sensing margin of the memory cell, is reduced.

Therefore, the determination criterion should be dynamically compensated for according to the program property of the nonvolatile memory device.

A nonvolatile memory device and a method for driving the same according to an embodiment of the present invention determines a program property of a memory cell and controls the voltage level of a sensing node to accurately determine data written in the memory cell regardless of the size of the memory cell and/or the degradation of the memory cell, which may result from repetitive write/erase cycles.

Figure 2:
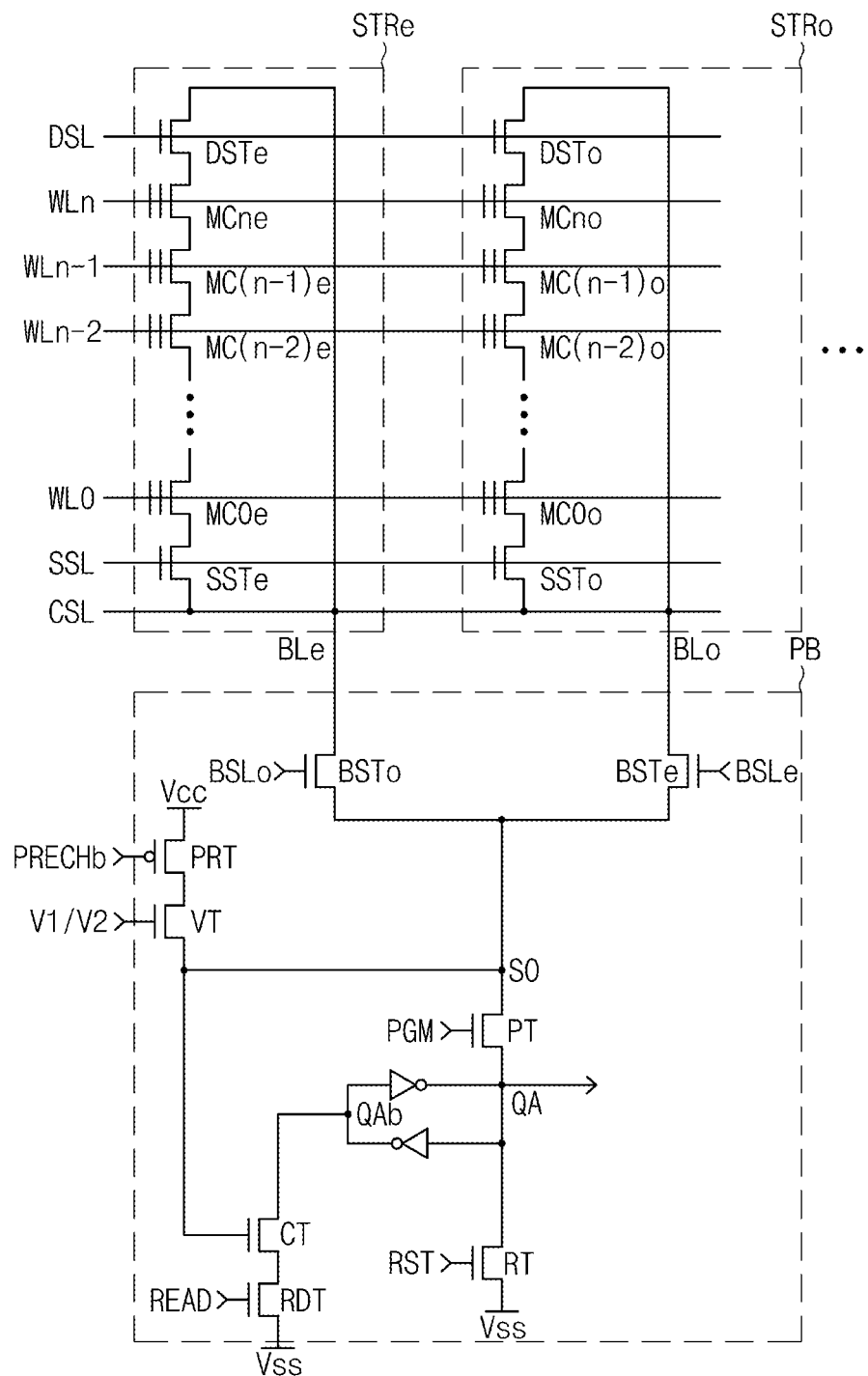
FIG. 2 illustrates a circuit diagram of a nonvolatile memory device.

FIG. 2 illustrates a circuit diagram of a nonvolatile memory device. For the simplicity of explanation, FIG. 2 illustrates a pair of memory strings including an even memory string STRe and an odd memory string STRo among a plurality of memory strings included in a memory cell array. Similarly, FIG. 2 illustrates one page buffer circuit PB among a plurality of page buffer circuits included in a page buffer unit.

As shown in FIG. 2, the memory string pair STRe and STRo receives driving voltages provided from a voltage driver (not shown) through a common source line CSL, a string select line SSL, a plurality of word lines WL0 to WLn, and a drain select line DSL.

The page buffer circuit PB is coupled to bit lines BLe and BLo to provide a current or a voltage to the bit lines BLe and BLo or to sense a current or a voltage of the bit lines BLe and BLo.

An even bit line select transistor BSTe and an odd bit line select transistor BSTo are switching elements that are turned on or off in response to bit line select signals BSLe and BSLo, respectively, to select one of the bit lines BLe and BLo.

In this embodiment, a precharge transistor PRT and a voltage providing transistor VT, which are turned on or off in response to a precharge enable signal PRECHb and a first voltage V1, respectively, provide a precharge current Ipre to a sensing node S0. The precharge current Ipre is provided to a selected bit line through the sensing node S0 and a selected one of the bit line select transistors BSTe and BSTo, thereby precharging the selected bit line.

When the precharge transistor PRT is turned on, a voltage provided to a first terminal of the voltage providing transistor VT connected to the precharge transistor PRT is maintained to be constant. However, as the level of the first voltage V1 applied to a gate terminal of the voltage providing transistor VT changes, a current, i.e., the precharge current Ipre, provided to the sensing node S0 connected to a second terminal of the voltage providing transistor VT may be changed. As such, the page buffer circuit PB of the nonvolatile memory device shown in FIG. 2 may control the precharge current Ipre by adjusting the level of the first voltage V1 applied to the voltage providing transistor VT.

Figure 3:
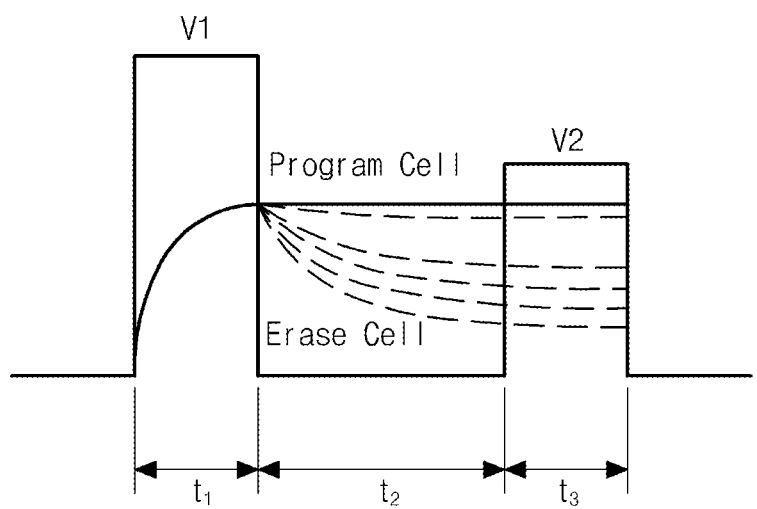
FIG. 3 illustrates a voltage level of a sensing node in precharging and sensing operations.

FIG. 3 illustrates a voltage level of the sensing node S0 in precharging and sensing operations. FIG. 3 will be described with reference to FIG. 2. During a precharging period t1, the sensing node S0 is precharged when the voltage V1 is applied to the voltage providing transistor VT. Conventionally, an operation of reading data written in a memory cell, i.e., a sensing operation, is performed following the precharging operation. However, in this embodiment, the precharging operation and the sensing operation will be described separately. The precharging operation may correspond to a precharging operation included in a programming operation, and the sensing operation may correspond to a verifying operation included in the programming operation.

During an evaluation period t2, turn-on voltages are applied to the drain select line DSL and the string select line SSL, and thus the drain select transistors DSTe and DSTo and the string select transistors SSTe and SSTo are turned on. Further, a read voltage Vread is applied to a selected one of the plurality of word lines WL0 to WLn while a pass voltage Vpass is applied to unselected word lines. If the selected word line, which is connected to a selected memory cell from which data is to be read out, is driven by the read voltage Vread, a cell current Icell may flow or may not flow according to the difference between the read voltage Vread and the threshold voltage of the selected memory cell. If the threshold voltage of the selected memory cell is smaller than the read voltage Vread, the selected memory cell is turned on and thus the cell current Icell flows. On the other hand, if the threshold voltage is larger than the read voltage Vread, the selected memory cell is turned off, so that a current path is blocked.

During the evaluation period t2, a voltage level of the sensing node S0 changes depending on the state of the selected memory cell. If the threshold voltage of the selected memory cell is larger than the read voltage Vread, i.e., the selected memory cell is in the programming state, the current path is blocked, and thus the voltage level of the sensing node S0 is maintained at substantially the same level as a precharge voltage level. However, in some instances, the voltage level of the sensing node may be decreased due to degradation of the memory cell or parasitic capacitances of the bit line BLe or BLo.

On the other hand, if the threshold voltage of the selected memory cell is smaller than the read voltage Vread, i.e., the selected memory cell is in the erasing state, the cell current Icell flows through the selected memory cell. Thus, the voltage level of the sensing node S0 decreases considerably compared to when the selected memory cell is in the programming state.

As described above, the voltage level of the sensing node S0 may differently change according to the state of the selected memory cell.

During a sensing period t3, a read signal READ is enabled and a read transistor RDT is turned on in response to the read signal READ.

If the selected memory cell is in the programming state, a determination transistor CT is turned on by the voltage level of the sensing node S0, and thus a value of '1' is stored in an input/output node QA. On the other hand, if the selected memory cell is in the erasing state, the determination transistor CT is turned off by the voltage level of the sensing node S0, and thus a value of '0' is stored in the input/output node QA.

However, as described above, the voltage level of the sensing node S0 may be decreased when the selected memory cell is in the programming state due to the degradation of memory cells or the parasitic capacitances of the bit line BLe or BLo. In this case, a data read failure may occur. For instance, the memory cell in the programming state may be determined to be in the erasing state because of the decreasing voltage level of the sensing node S0. Therefore, during the sensing period t3, a second voltage V2 is applied to the voltage providing transistor VT to increase the voltage level of the sensing node S0 to prevent the data read failure.

Here, the levels of the first voltage V1 and the second voltage V2 may be set differently according to the memory cell property. The nonvolatile memory device and the method for driving the same according to an embodiment of the present invention recognize properties of memory cells by page units and determine the levels of the first voltage V1 and the second voltage V2 according to the properties of the memory cells by block units.

Further, a reset transistor RT coupled to and disposed between the input/output node QA and a ground terminal Vss may discharge the input/output node QA to a ground voltage level in response to a reset signal RST.

The nonvolatile memory device and the method for driving the same according to an embodiment of the present invention determine the levels of the first voltage V1 and the second voltage V2 according to the property of the memory cells. Hereinafter, an operation for determining the levels of the first voltage V1 and the second voltage V2 will be described in more detail.

Figure 4:
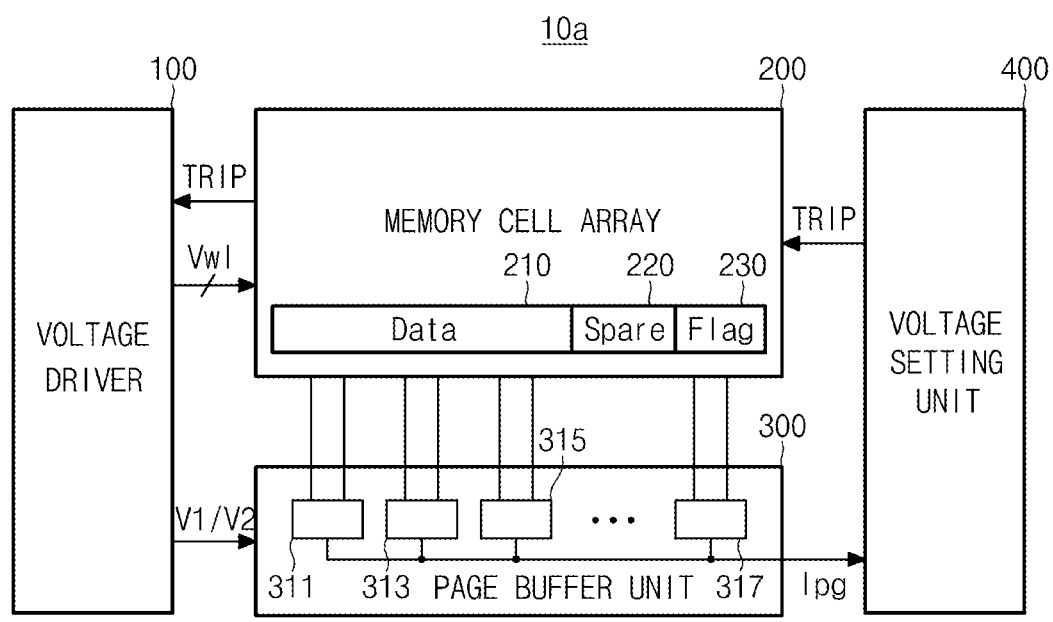
FIG. 4 illustrates a block diagram of a nonvolatile memory device according to an embodiment of the present invention.

FIG. 4 illustrates a block diagram of a nonvolatile memory device according to an embodiment of the present invention.

Referring to FIG. 4, the nonvolatile memory device 10a includes a voltage driver 100, a memory cell area 200, a page buffer unit 300, and a voltage setting unit 400.

The voltage driver 100 provides voltages to a plurality of word lines WL0 to WLn, a drain select line DSL, and a string select line SSL of the memory cell array 200 as illustrated in FIG. 2. The voltage driver 100 may provide the voltages, which are generated based on a voltage control signal received from an external device such as a host, to the memory cell array based on an address signal.

Further, the voltage driver 100 provides a first voltage V1 and a second voltage V2 to the page buffer unit 300 in response to a voltage setting signal TRIP. The voltage setting signal TRIP is generated in the voltage setting unit 400 based on program properties of pages constituting one block of the memory cell array 200. The voltage setting signal TRIP is stored in a flag region 230 included in a page of the memory cell array 200, and then the voltage setting signal TRIP is provided to the voltage driver 100.

Here, the voltage driver 100 may generate driving voltages and provide the driving voltages to specific parts.

The memory cell array 200 may include a plurality of memory blocks, each of which includes a plurality of pages. In an embodiment, a programming operation and an erasing operation may be performed on a page basis and a block basis, respectively.

In general, one page may include a plurality of memory cells coupled to a single word line. The page may include a data region 210 configured to store data, a spare region 220 configured to store information including an error correction code (ECC) and block failure information, and the flag region 230. The flag region 230 is configured to store voltage setting information included in the voltage setting signal TRIP. Memory cells included in each of the data region 210, the spare region 220, and the flag region 230 may be fabricated through the same process.

In an embodiment, the voltage setting signal TRIP is generated with respect to a plurality of pages included in one memory block, but voltage setting information included in the voltage setting signal TRIP is stored in one page of the plurality of pages. Accordingly, the flag region 230 storing the voltage setting information is included in one page of the plurality of pages in one block, while the other pages of the block do not include the flag region 230. Therefore, the flag region 230 included in the page needs to be read out to recognize the program property of the block and to provide the first voltage V1 and the second voltage V2.

The page buffer unit 300 includes a plurality of page buffer circuits 311 to 317. The page buffer circuits 311 to 317 are coupled to respective bit line pairs included in the memory cell array 200 so that the page buffer circuits 311 to 317 are used to read or write data from or to memory cells in the memory cell array 200.

Each of the plurality of page buffer circuits 311 to 317 may have substantially the same configuration as the page buffer circuit PB illustrated in FIG. 2. Each of the plurality of page buffer circuits 311 to 317 adjusts a precharge voltage level of a corresponding sensing node S0 using the first voltage V1 provided from the voltage driver 100 and increases a sensing voltage level of the sensing node S0 using the second voltage V2 during a sensing operation. In this manner, a level of a cell current Icell of a memory cell can be compensated for.

By compensating for the level of the cell current Icell, a verifying voltage level of the sensing node S0 is maintained at a constant level regardless of the degradation of the memory cell or the parasitic capacitances of the bit line. The verifying voltage level of the sensing node S0 is applied to the determination transistor CT shown in FIG. 2, and is used to determine a state of the memory cell. In other words, when the level of the cell current Icell flowing through the memory cell changes, the page buffer circuit compensates for the voltage level of the sensing node S0 to maintain a constant verifying voltage level and compensate for the decrease of the cell current Icell.

The compensating operation may be applied to a verifying operation. The verifying operation and the read operation are classified according to whether the voltage applied to a selected word line is a read voltage Vread or a verify voltage Vvrf. In general, even if the verify voltage Vvrf is larger than the read voltage Vread, the first voltage V1 and the second voltage V2 may be set to have substantially the same level for every block. However, in another embodiment, the read voltage Vread and the verify voltage Vvrf provided to a gate electrode of a selected memory cell may be different from each other, and thus the first voltage V1 and the second voltage V2 may be controlled to have different levels from each other.

The voltage setting unit 400 recognizes a program property of every block of the memory cell array 200, generates the voltage setting signal TRIP with respect to a corresponding block, and stores the voltage setting signal TRIP in the flag region 230 included in the memory cell array 200.

Hereinafter, a method of generating the voltage setting signal TRIP in the voltage setting unit 400 will be described in detail.

The nonvolatile memory device 10a may use a method of writing data according to an incremental step pulse program (ISPP). A number of the memory cells whose states are changed after a first loop program of the ISPP is executed may be determined. In an embodiment, the first loop program is executed by performing a predetermined number of loop programs among a plurality of loop programs constituting the ISPP.

After the first loop program is executed, in each of the page buffer circuits 311 to 317, memory cells included in a corresponding page are classified into '0' memory cells or '1' memory cells according to whether the memory cells included in the page are programmed or not. That is, it is determined whether the memory cells are in the programming state or in the erasing state by detecting cell currents Icell flowing through the memory cells.

The cell currents from the plurality of page buffer circuits 311 to 317 are summed and provided to the voltage setting unit 400 as a page current Ipg. Since cell currents Icell flow only through memory cells having a threshold voltage smaller than the verify voltage Vvrf (i.e., memory cells in the erasing state) and are transferred to the page buffer circuits 311 to 317, the page current Ipg has a level in proportion to the number of memory cells in the erasing state after the first loop program is completed.

The voltage setting unit 400 compares the page current Ipg with a reference current Iref to generate a data pass signal PF, and generates a voltage select signal SEL based on a bias signal MOSB and a program pulse number signal PPN. Here, the bias signal MOSB may be used to generate the reference current Iref, and the reference current Iref may have a level in proportion to the number of memory cells in the erasing state before the first loop program is executed.

The voltage select signal SEL may be generated through a logical operation performed based on the bias signal MOSB, the data pass signal PF, and the program pulse number signal PPN. Then, the first voltage V1 and the second voltage V2 may be set according to the voltage select signal SEL. For example, a corresponding relationship between the voltage select signal SEL and the first and second voltages V1 and V2 may be set by performing a cumulative analysis, and the corresponding relationship may be stored as voltage setting information in the voltage setting unit 400.

The voltage setting signal TRIP generated in the voltage setting unit 400 may include the voltage setting information corresponding to the voltage select signal SEL and be provided to the memory cell array 200.

Therefore, the voltage setting signal TRIP is set with respect to a corresponding page, and then is stored in the flag region 230 of the page included in a corresponding block. Afterwards, the voltage setting signal TRIP may be used in read and/or verifying operations of other pages in the same block.

In another embodiment, the voltage setting unit 400 may generate the voltage select signal SEL with respect to a plurality of pages included in one block. The voltage setting signal TRIP may be set as an average value. For example, the voltage select signal SEL and the voltage setting signal TRIP may be generated in regards to a unit page as mentioned above. However, for enhancing an operational speed, the voltage select signal SEL and the voltage setting signal TRIP may be generated in regards to a unit block including a plurality of pages. In that case, the voltage select signal SEL in regards to the unit block may be generated by averaging voltage select signals in regards to the pages included in the unit block.

Figure 5:
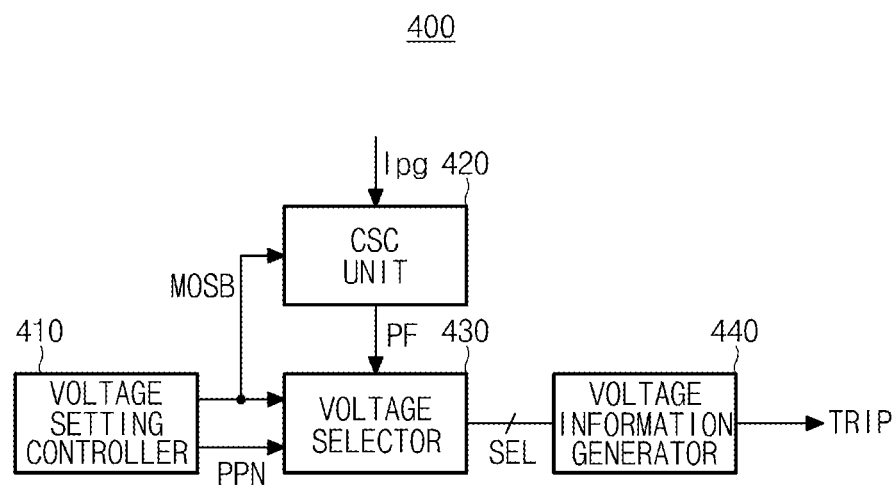
FIG. 5 illustrates a block diagram of a voltage setting unit according to an embodiment of the present invention.

FIG. 5 illustrates a detailed block diagram of the voltage setting unit 400 according to an embodiment of the present invention.

Referring to FIG. 5, the voltage setting unit 400 includes a voltage setting controller 410, a current source and comparator (CSC) unit 420, a voltage selector 430, and a voltage information generator 440.

The voltage setting controller 410 generates the bias signal MOSB and the program pulse number signal PPN, and stores a correspondence table representing a relationship between the voltage select signal SEL for generating the voltage setting signal TRIP and the first and second voltages V1 and V2.

The bias signal MOSB may be generated based on states of memory cells, which have just been programmed before the first loop program is performed, in a corresponding block, and the program pulse number signal PPN may be generated according to the predetermined number of loop programs, that is, according to which position is occupied by the first loop program among the plurality of loop programs. That is, the program pulse number signal PPN is determined based on how many loop programs are performed before the first loop program is completed. In this description, the program pulse number signal PPN indicates the number of the loop programs that are performed. For example, if a program loop is performed twice, the program pulse number signal PPN indicates '2'.

The CSC unit 420 compares the reference current Iref generated based on the bias signal MOSB with the page current Ipg provided from the page buffer unit 300, and generates the data pass signal PF.

The voltage selector 430 performs a logical operation on the bias signal MOSB, the program pulse signal PPN, and the data pass signal PF, and generates the voltage select signal SEL.

The voltage information generator 440 generates the voltage setting signal TRIP based on the voltage select signal SEL. A voltage-setting matching table including values of the first voltage V1 and the second voltage V2 that are matched with the voltage select signal SEL may be stored in the voltage information generator 440.

FIG. 6 illustrates a voltage-setting matching table showing a relationship between the voltage select signal SEL and the first and second voltages V1 and V2.

Referring to FIG. 6, when a first voltage select signal SEL<1> is generated, the number of '0' cells is set to 1, and the first voltage V1 and the second voltage V2 are set to 3 V. When a third voltage select signal SEL<3> is generated, the number of '0' cells is set to 20, and the first voltage V1 and the second voltage V2 are set to 2 V.

As described above, since the bias signal MOSB is generated based on states of memory cells that have been just programmed, it is possible to determine the number of memory cells having states that change to the programming state after the first program loop is completed by comparing the reference current Iref generated based on the bias signal MOSB with the page current Ipg.

In the voltage-setting matching table shown in FIG. 6, the '0' cells denote programmed cells, i.e., cells in the programming state. Moving from the first voltage select signal SEL<1> to other voltage select signals SEL<2> to SEL<i>, the number of the programmed cells increases. For instance, the third voltage select signal SEL<3> is generated when larger numbers of cells are programmed compared to the first voltage selection signal SEL<1> under the same conditions. This means that threshold voltages of the memory cells are relatively high and there is a large number of memory cells determined to be programmed. Therefore, when the third voltage select signal SEL<3> is generated, it is determined that the memory cells of the corresponding page have better charge accumulation capabilities. Thus there is relatively less of a need to significantly increase the voltage level of the sensing node S0. The levels of the first voltage V1 and the second voltage V2 corresponding to the third voltage select signal SEL<3> are lower than those corresponding to the first voltage select signal SEL<1>.

The voltage-setting matching table may be generated according to a cumulative program property, and may be pre-set in the initial stages of the nonvolatile memory device and stored in the nonvolatile memory device.

Figure 7:
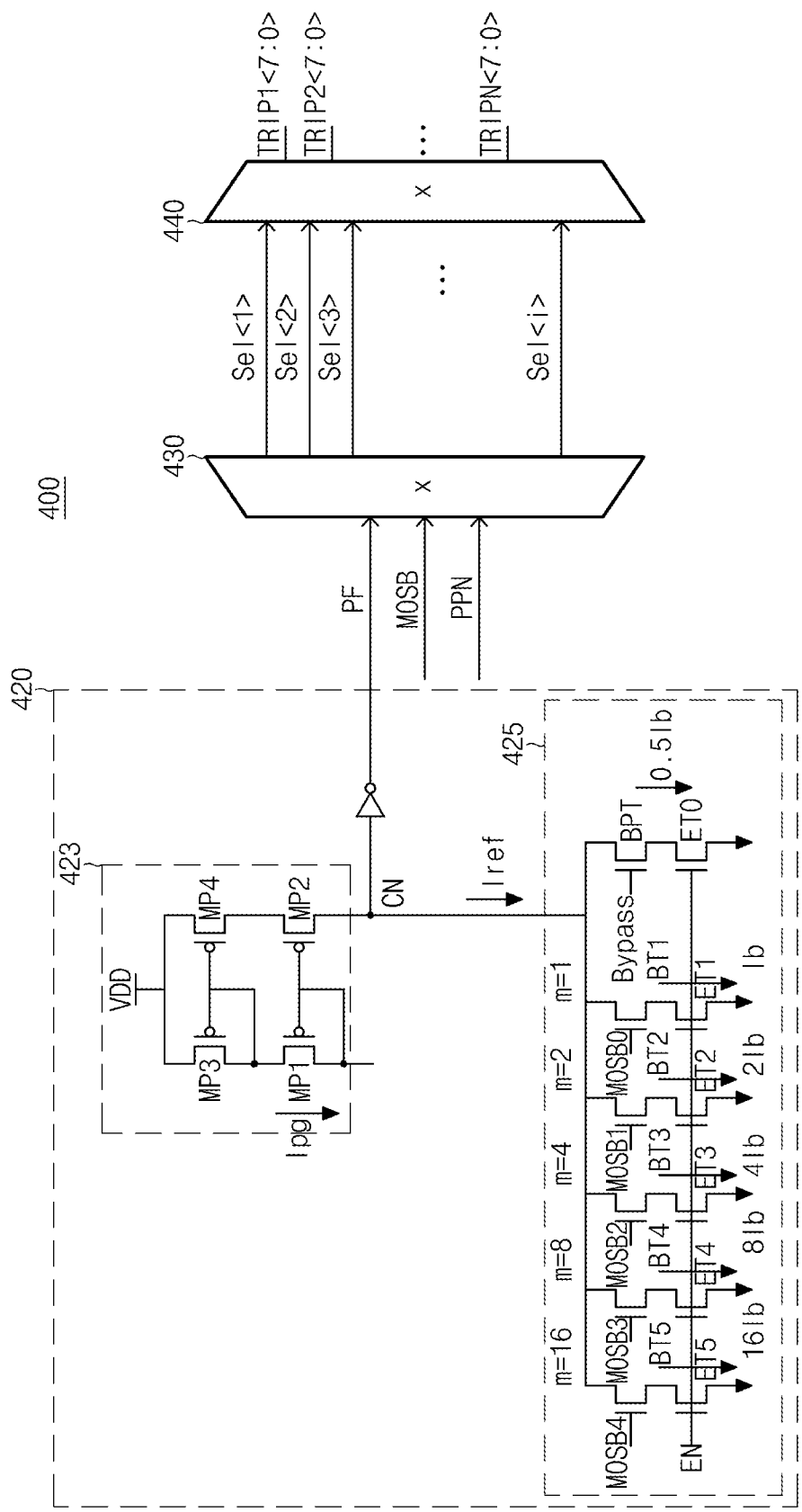
FIG. 7 illustrates a detailed circuit diagram of the voltage setting unit shown in FIG. 5.

FIG. 7 illustrates a detailed circuit diagram of the voltage setting unit 400 shown in FIG. 5.

Referring to FIG. 7, the voltage setting unit 400 includes a CSC unit 420, a voltage selector 430, and a voltage information generator 440. The CSC unit 420 includes a current mirror 423 and a reference current generator 425.

The current mirror 423 includes a plurality of PMOS transistors MP1, MP2, MP3, and MP4. Gates of the first and second PMOS transistors MP1 and MP2 are connected to each other. The page current Ipg is received through a first terminal of the first PMOS transistor MP1, and the first terminal of the first PMOS transistor MP1 is connected to the gate thereof. A second terminal of the first PMOS transistor MP1 is connected to a first terminal of the third PMOS transistor MP3, and the first terminal of the third PMOS transistor MP3 is connected to gates of the third PMOS transistor MP3 and the fourth PMOS transistor MP4. A second terminal of the third PMOS transistor MP3 is connected to a power voltage terminal VDD.

The fourth PMOS transistor MP4 includes a first terminal connected to a second terminal of the second PMOS transistor MP2. In addition, the gate of the fourth PMOS transistor MP4 is connected to the gate of the third PMOS transistor MP3, and a second terminal is connected to the power voltage terminal VDD.

The first to fourth PMOS transistors MP1, MP2, MP3, and MP4 may have a basic cascode current mirror structure, and may be substantially the same size.

Therefore, the page current Ipg mirrors the first terminal of the second PMOS transistor MP2, which is connected to a comparison node CN.

The first to fourth PMOS transistors PM1, PM2, PM3, and PM4 shown in FIG. 6 are illustrative. In another embodiment, any structure that is able to provide substantially the same current as the page current Ipg to the comparison node CN may be used.

The reference current generator 425 generates the reference current Iref based on the bias signal MOSB. The reference current generator 425 includes a plurality of bias transistors BT1 to BT5, which may have different sizes. Since the plurality of bias transistors BT1 to BT5 are different sizes, the plurality of bias transistors BT1 to BT5 may provide a reference current Iref having different levels in response to the bias signal MOSB. That is, since the bias signal MOSB has a plurality of bits, e.g., MOSB0 to MOSB4, to control the plurality of bias transistors BT1 to BT5, respectively, the level of the reference current Iref is determined by the plurality of bias transistors BT1 to BT5, which are selectively activated or deactivated in response to a bit combination of the bias signal MOSB.

In FIG. 7, the plurality of bias transistors BT1 to BT5 may have sizes sequentially increasing as much as $2^N$ times of the smallest size thereof, N being 0 or a positive integer. However, the size of the bias transistors is not limited thereto.

The bias transistors BT1, BT2, BT3, BT4, and BT5 are respectively connected to enable transistors ET1, ET2, ET3, ET4, and ET5, each of which is connected to a ground voltage terminal, so that the reference current Iref is generated in response to an enable signal EN. The reference current generator 425 further includes a bias pass transistor BPT and an enable transistor ET0, which are serially connected to each other and disposed between the comparison node CN and the ground voltage terminal. The bias pass transistor BPT operates in response to a bypass signal Bypass, and the enable transistor ET0 operates in response to the enable signal EN.

The reference current Iref and the page current Ipg are compared in the comparison node CN, and the data pass signal PF is generated based on the result of the comparison. For example, if the page current Ipg is larger than the reference current Iref, the data pass signal PF has a value corresponding to a logical state 'low'. On the other hand, if the page current Ipg is smaller than the reference current Iref, the data pass signal PF has logical value corresponding to a logical state 'high' in accordance with a voltage level of the comparison node CN.

The voltage selector 430 performs a logical operation on the bias signal MOSB, the program pulse number signal PPN, and the data pass signal PF, and generates the voltage select signal SEL. The voltage select unit 430 may include a multiplexer.

The voltage information generator 440 receives the voltage select signal SEL and generates the voltage setting signal TRIP corresponding to the voltage select signal SEL. The voltage information generator 440 may include a demultiplexer. The voltage information generator 440 includes the voltage-setting matching table showing the correspondence relationship between the voltage select signal SEL and the first and second voltages V1 and V2 as illustrated in FIG. 6, and generates the voltage setting signal TRIP using the voltage-setting matching table. Alternatively, if the voltage setting controller 410 includes the voltage-setting matching table, the voltage information generator 440 may read information for the correspondence relationship from the voltage setting controller 410 to generate the voltage setting signal TRIP. In an embodiment, as shown in FIG. 7, one of voltage setting signals TRIP1<7:0> to TRIPN<7:0> is generated based on a corresponding one of voltage select signals Sel<1> to Sel<i>.

Figure 8:
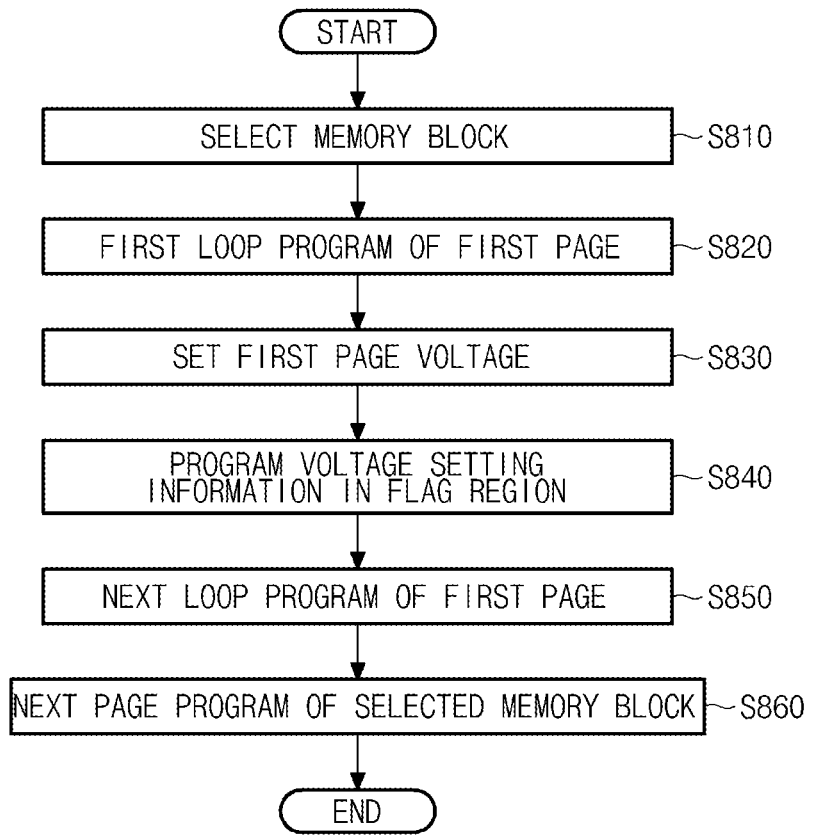
FIG. 8 to FIG. 10 are flowcharts illustrating an operation of a nonvolatile memory device according to an embodiment of the present invention.
Figure 9:
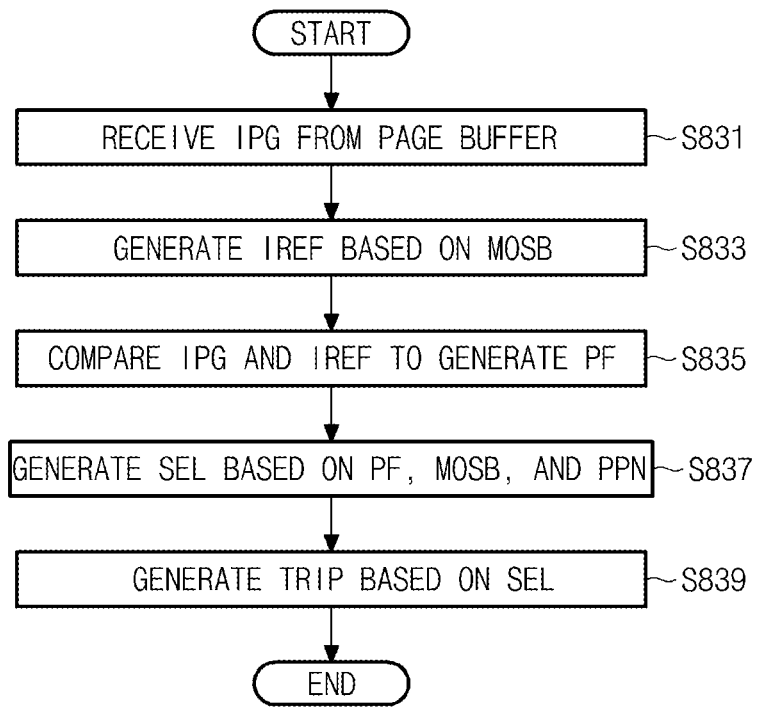
Figure 10:
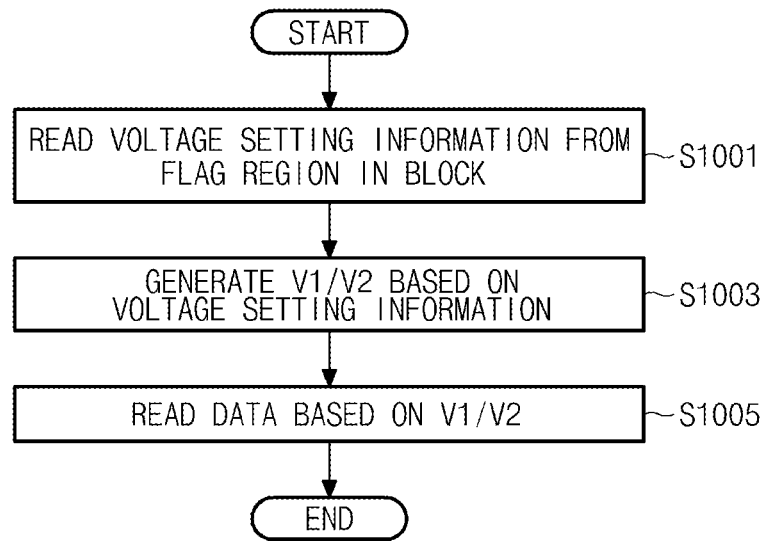

FIGS. 8 to 10 are flowcharts illustrating operations of a nonvolatile memory device according to an embodiment of the present invention. A method for driving the nonvolatile memory device according to an embodiment of the present invention will be described with reference to FIGS. 8 and 9 and FIGS. 2 to 7.

Referring to FIG. 8, a memory block in which data is to be written is selected at step S810. A first page of the selected memory block is programmed by performing the first loop program of the ISPP on the first page at step S820. The first page may correspond to a least significant bit (LSB) page. Here, the performing of the first loop program means that only the predetermined number of loop programs is performed on the first page.

After the first loop program is completed, the first and second voltages V1 and V2 are set by considering program properties of memory cells of the first page at step S830. The first and second voltages V1 and V2 may be set in the voltage setting unit 400 as described with reference to FIGS. 4 to 6.

FIG. 9 specifically illustrates a voltage setting process for the page on which the programming is performed.

Referring to FIG. 9, after the first program loop is completed, current may or may not flow in the page buffer circuits coupled to the bit line pairs, respectively. The CSC unit 420 included in the voltage setting unit 400 receives the page current Ipg, which is obtained by summing up currents flowing in the plurality of page buffer circuits, from the page buffer unit 300 at step S831, and generates the reference current Iref based on the bias signal MOSB provided from the voltage setting controller 410 at step S833. The bias signal MOSB may be provided from the voltage setting controller 410 according to a preset value. Alternatively, the bias signal MOSB may be set to generate the reference current Iref having a level corresponding to the number of memory cells in the erasing state after a previous program loop is performed.

The page current Ipg and the reference current Iref are compared to generate the data pass signal PF at step S835. According to a result of the comparison, the data pass signal PF has a value of a logical state 'high' or a value of a logical state 'low'.

The voltage selector 430 of FIG. 7 generates the voltage select signal SEL based on the data pass signal PF, the bias signal MOSB, and the program pulse number signal PPN at step S837. The voltage select signal SEL may be generated by performing a logical operation on the data pass signal PF, the bias signal MOSB, and the program pulse number signal PPN. The logical operation may be determined according to a preset logical table. At step S839, the voltage setting signal TRIP is generated based on the first and second voltages V1 and V2 corresponding to the voltage select signal SEL. The voltage setting signal TRIP includes voltage setting information.

Returning to FIG. 8, the voltage setting information is written in the flag region 230 of a corresponding page in a corresponding memory block of the memory cell array 200 at step S840.

Afterwards, the next program loop is performed on the first page, and thus the programming operation of the first page is completed at step S850. If the voltage setting information is stored in the flag region 230, the program operation is performed based on the stored voltage setting information.

While the next program loop is performed on the first page, the first voltage V1 is provided to the page buffer unit 300 to adjust the precharge level of the sensing node S0 of FIG. 2. After that, if a program pulse is applied, the second voltage V2 is provided to the page buffer unit 300 to adjust the verifying level of the sensing node S0 in the verifying operation. As described above, the adjustment of the verifying level and the precharging level of the sensing node S0 has an effect similar to providing an additional current to the sensing node S0 to compensate for reduction of the cell current Icell of the memory cell to be programmed.

After the program for the first page is completed, the programming operation is sequentially performed on the other pages in the corresponding block. When the program for a most significant bit (MSB) page, which is the last page of the corresponding block, is completed, the whole program operation for the corresponding block is terminated at step S860.

Similarly, the programming operation of the other pages is also performed based on the first voltage V1 and second voltage V2 according to the voltage setting information stored in the flag region 230 of the first page.

FIG. 10 is a flowchart illustrating a read operation performed after the voltage setting information is set.

Referring to FIG. 10, when a memory cell on which the read operation is performed is selected in response to a memory cell designation signal such as an address signal, the voltage setting information is read from the flag region 230 of one page included in a block including the selected memory cell at step S1001.

As step S1003, the first voltage V1 and the second voltage V2 are generated in the voltage driver 100 according to the voltage setting information read out of the flag region 230. At step S1005, the first voltage V1 and the second voltage V2 are sequentially provided to the voltage providing transistor VT as illustrated in FIG. 3, and data stored in the selected memory cell is read out.

As described above, to prevent a data read failure from occurring due to reduction of the cell current Icell according to the program property of the memory cell and repetitive write/erase cycles, the nonvolatile memory device and the method for driving the same according to an embodiment of the present invention provide the first voltage V1 and the second voltage V2 and compensate for the level reduction of the cell current Icell based on the first and second voltage V1 and V2. As a result, the nonvolatile memory device can substantially reduce the level of the cell current Icell, which is required to stably read data.

The nonvolatile memory device and the method for driving the same according to an embodiment of the present invention sense and determine a reduction of the cell current Icell according to the program property of the memory cell. In addition, the nonvolatile memory device and the method for driving the same generate voltage setting information for repeatedly performing write/erase cycles by block units. As a result, operational reliability of the nonvolatile memory device can be improved even as performance of the device degrades over time.

Figure 11:
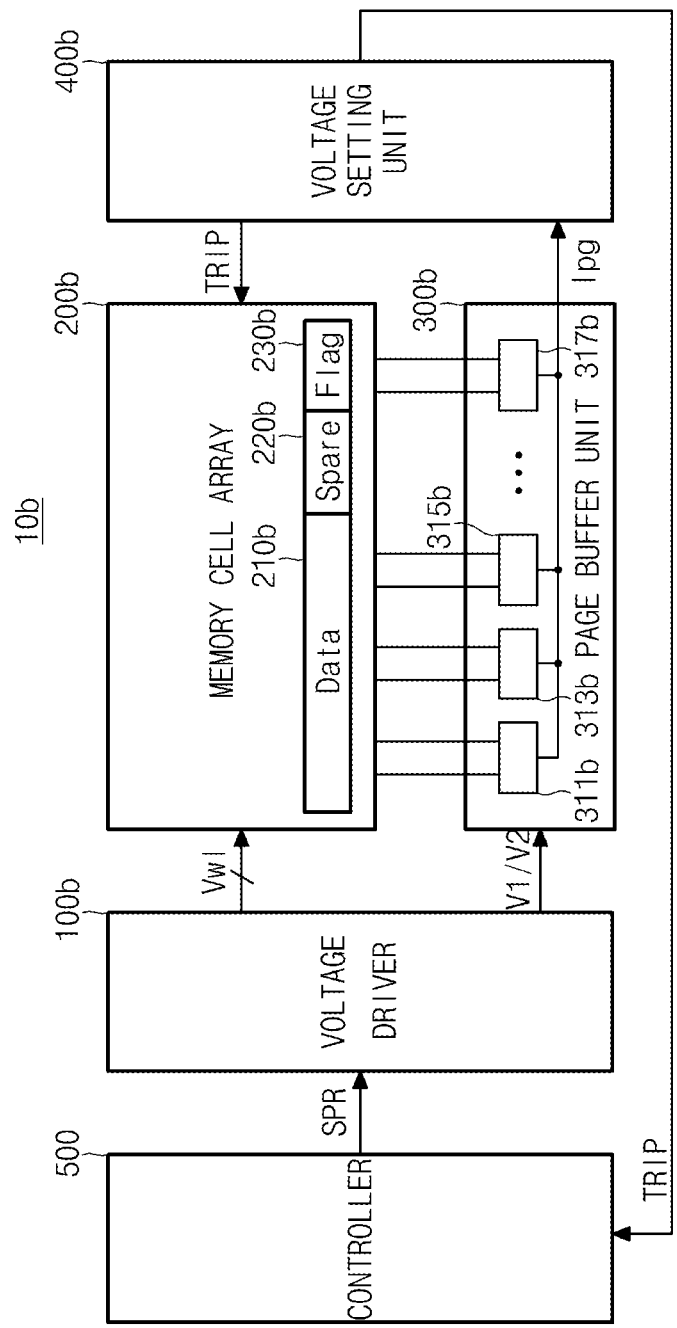
FIG. 11 illustrates a block diagram of a nonvolatile memory device according to another embodiment of the present invention.

FIG. 11 illustrates a block diagram of a nonvolatile memory device according to another embodiment of the present invention.

The nonvolatile memory device 10b of FIG. 11 further includes a controller 500, compared with the nonvolatile memory device 10a of FIG. 4.

The controller 500 receives a voltage setting signal TRIP from a voltage setting unit 400b, matches the voltage setting signal TRIP with a corresponding block, and stores voltage setting information for each block. After that, if an operation for the specific block is performed, the controller 500 provides the voltage setting information for the specific block, which is previously stored therein, as a voltage setting parameter SPR to a voltage driver 100b. In an embodiment, the voltage setting signal TRIP may be stored in a code address memory (CAM) or the like included in the nonvolatile memory device instead of the controller 500.

Therefore, when an operation for a memory cell included in the specific block is performed, the nonvolatile memory device 10b can perform the operation based on the voltage setting parameter SPR provided from the controller 500 without reading out the voltage setting information stored in a flag region, e.g., 230b, of the specific block including the memory cell.

The voltage driver 100b provides the first and second voltages V1 and V2 based on the voltage setting parameter SPR to a page buffer unit 300b, and the page buffer unit 300b performs a corresponding operation. A process of providing the page current Ipg to a voltage setting unit 400b to perform voltage setting and a process of generating the voltage setting signal TRIP in the voltage setting unit 400b are the same as those described in the above-described embodiment, and thus detailed description thereof will be omitted.

In the nonvolatile memory device 10b of FIG. 11, the voltage setting signal TRIP is provided to the controller 500 and/or a memory cell array 200b. The voltage setting signal TRIP is stored in the controller 500, and thus the process of reading out the voltage setting information in the flag region 230b included in a memory cell array 200b is not necessary. As a result, it is possible to reduce an operating time.

In an embodiment, the voltage setting information may be also stored in the flag region 230b included in the memory cell array 200b. If the voltage setting information is stored in the flag region 230b having substantially the same property as the memory cell, the accuracy of the voltage setting information may be improved.

Figure 12:
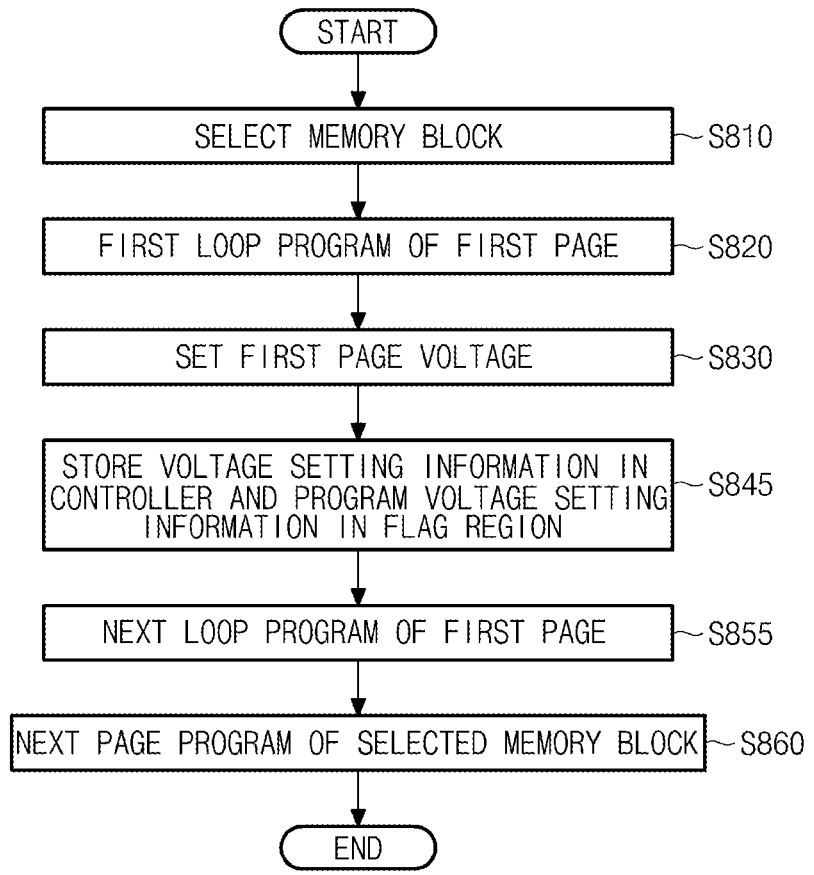
FIGS. 12 and 13 are flowcharts illustrating a method of driving the nonvolatile memory device of FIG. 11.
Figure 13:
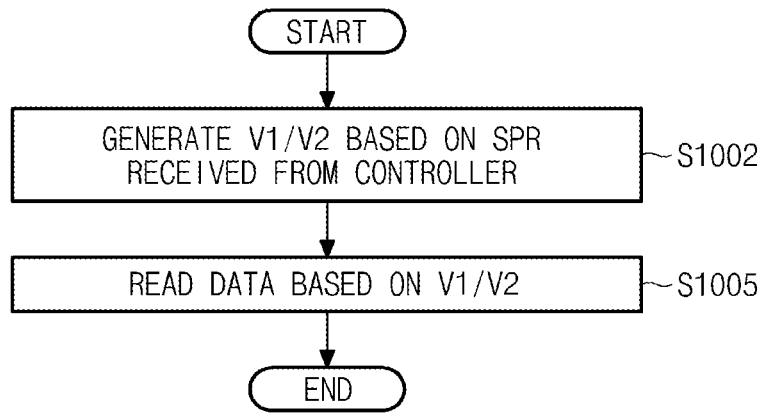

FIGS. 12 and 13 illustrate a method of driving the nonvolatile memory device 10b of FIG. 11.

FIG. 12 is a flowchart illustrating a voltage setting process of the nonvolatile memory device 10b.

Referring to FIG. 12, processes of selecting a memory block and performing a first loop program on a first page of the selected memory block to set V1 and V2 voltages for the first page are substantially the same as those described in steps S810 to S830 of FIG. 8.

In the nonvolatile memory device 10b, the voltage setting signal TRIP including the voltage setting information is provided to and stored in the controller 500 at step S845. In another embodiment, the voltage setting signal TRIP may be also stored in the flag region 230b in the memory cell array 200b at step S845.

The next loop program for the first page is performed based on the voltage setting parameter SPR stored in the controller 500 to complete the program operation of the first page at step S855. After that, the next page of the selected block is sequentially programmed, and finally the last page of the selected block is programmed to complete the program operation for the selected block at step S860.

FIG. 13 is a flowchart illustrating a read operation of the nonvolatile memory device 10b of FIG. 11.

Referring to FIG. 13, when data is read from a memory cell in which the data has been written based on a memory cell designation signal such as an address signal, the controller 500 provides the voltage setting parameter SPR for a block including the selected memory cell to the voltage driver 100b to generate the first and second voltages V1 and V2 at step S1002.

The first and second voltages V1 and V2 are provided to the page buffer unit 300b to adjust a level of a sensing node S0 in precharging and sensing operations.

As described above, the nonvolatile memory device and the method for driving the same according to an embodiment of the present invention provide the voltages V1 and V2 to increase the level of the sensing node in the precharging and sensing operations. Thus, the voltages V1 and V2 are provided to compensate for a reduction in the level of the sensing node due to reduction in the cell current according to degradation of the program property of the memory cell, which occurs because write and erase cycles are repetitively performed on the memory and because of the capacitance of a bit line itself. As a result, in the nonvolatile memory device, it is possible to substantially reduce the level of a cell current for data verification.

Further, in a nonvolatile memory device and the method for driving the same according to an embodiment of the present invention, since data is written and verified using a cell current Icell having a low level, it is possible to minimize degradation of each memory cell.

The above embodiments of the invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A nonvolatile memory device, comprising:
a memory cell array including a plurality of blocks, each block including a plurality of pages each of which includes a plurality of memory cells coupled to a plurality of bit lines and a plurality of word lines crossing the bit lines;
a voltage driver configured to provide a plurality of word line voltages to the word lines, and generate a first voltage during a precharging operation and a second voltage during a sensing operation based on a voltage setting signal;
a page buffer unit configured to adjust a precharging level of a sensing node coupled to a selected bit line of a selected page included in a selected block of the memory cell array using the first voltage, and adjust a sensing level of the sensing node using the second voltage; and
a voltage setting unit configured to receive a page current from the page buffer unit and generate the voltage setting signal, after a predetermined number of loop programs among a plurality of loop programs of an incremental step pulse program is performed,
wherein the voltage driver is configured to generate the word line voltages to perform the incremental step pulse program on the selected page.

2. The nonvolatile memory device of claim 1, wherein the voltage setting unit includes:
a voltage setting control unit configured to generate a bias signal based on previous states of memory cells included in the selected page before the predetermined number of loop programs is performed and generate a program pulse number signal based on information on the predetermined number of loop programs;
a current source and comparator (CSC) unit configured to generate a reference current based on the bias signal and compare the page current with the reference current to generate a data pass signal;
a voltage selector configured to generate a voltage select signal based on the data pass signal, the bias signal, and the program pulse number signal; and
a voltage information generator configured to generate the voltage setting signal based on the voltage select signal.

3. The nonvolatile memory device of claim 2, wherein the voltage selector is configured to perform a logical operation on the data pass signal, the bias signal, and the program pulse number signal, and generate the voltage select signal.

4. The nonvolatile memory device of claim 2, wherein the voltage information generator is configured to generate the voltage setting signal using a voltage-setting matching table including a matched relationship between the first and second voltages and the voltage select signal.

5. The nonvolatile memory device of claim 4, wherein the voltage-setting matching table is generated based on a number of memory cells having states that are changed after the predetermined number of loop programs is performed.

6. The nonvolatile memory device of claim 2, wherein the voltage setting signal is stored in a flag region included in the selected page.

7. The nonvolatile memory device of claim 2, wherein the voltage setting signal is generated by block units.

8. The nonvolatile memory device of claim 2, wherein the CSC unit includes:
a current mirror configured to receive the page current and provide a mirrored current having substantially the same level as that of the page current to a comparison node; and
a reference current generator configured to generate the reference current based on the bias signal and provide the comparison node with the reference current,
wherein the mirrored current and the reference current are compared with each other, and the data pass signal is generated based on a result of the comparison.

9. The nonvolatile memory device of claim 1, further comprising at least one of a controller and a code address memory (CAM) region, which is configured to store the voltage setting signal.

10. The nonvolatile memory device of claim 1, wherein the page buffer unit includes a voltage providing transistor configured to adjust the precharging and sensing levels of the sensing node in response to the first voltage and the second voltage, respectively.

11. A method of driving a nonvolatile memory device, the method comprising:

performing a predetermined number of loop programs of an incremental step pulse program on a first page included in a selected memory block of a memory cell array;

generating a voltage setting signal based on a program property of the first page after the predetermined number of loop programs is completed; and adjusting a precharging level of a sensing node of the selected memory block using a first voltage generated based on the voltage setting signal during a precharging operation, and adjusting a sensing level of the sensing node using a second voltage generated based on the voltage setting signal during a sensing operation, wherein generating the voltage setting signal includes:
receiving a page current corresponding to current flowing in memory cells included in the first page;
comparing the page current with a reference current to generate a data pass signal; and
generating the voltage setting signal based on the data pass signal, the predetermined number of loop programs, and the reference current.

12. The method of claim 11, further comprising storing the voltage setting signal in at least one selected from a controller, a code address memory (CAM) region, and a certain page included in the selected memory block.

13. The method of claim 11, wherein generating the voltage setting signal based on the data pass signal, the predetermined number of the loop programs, and the reference current includes generating the voltage setting signal using a voltage-setting matching table, the voltage-setting matching table being generated based on a number of memory cells having states that are changed among the memory cells included in the first page after the predetermined number of loop programs is performed, the data pass signal, the predetermined number of the loop programs, and the reference current.

14. The method of claim 12, further comprising completing a program operation after the predetermined number of loop programs is performed, based on the voltage setting signal.

15. The method of claim 11, wherein the first page corresponds to a least significant bit (LSB) page of the selected memory block.

16. The method of claim 11, further comprising generating the reference current based on previous states of the memory cells in the first page before the predetermined number of loop programs is completed.

17. The method of claim 11, wherein the voltage setting signal is generated by memory block units.

18. The method of claim 11, wherein the first voltage and the second voltage are used in a write operation, a read operation, and a verify operation.

* * * * *